(12) United States Patent
Tamarkin

(10) Patent No.: US 8,068,338 B1  
(45) Date of Patent: Nov. 29, 2011

(54) NETWORK DEVICE WITH BAFFLE FOR REDIRECTING COOLING AIR AND ASSOCIATED METHODS

(75) Inventor: Vladimir Tamarkin, Huntingdon Valley, PA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 231 days.

(21) Appl. No.: 12/410,277

(22) Filed: Mar. 24, 2009

(51) Int. Cl.
H05K 7/20 (2006.01)

(52) U.S. Cl. ........ 361/692; 361/690; 361/695; 361/715; 454/184; 312/223.2; 174/16.1

(58) Field of Classification Search ............. 361/679.33, 361/679.49, 679.51, 690, 692, 695, 697, 361/704, 707, 715, 725, 796
See application file for complete search history.

(56) References Cited

U.S. PATENT DOCUMENTS

| | | | |
|---|---|---|---|
| 4,399,485 A * | 8/1983 | Wright et al. .................. | 361/693 |
| 5,077,601 A | 12/1991 | Hatada et al. | |
| 5,680,294 A * | 10/1997 | Stora et al. ..................... | 361/695 |
| 5,984,636 A | 11/1999 | Fahndrich et al. | |
| 6,015,008 A | 1/2000 | Kogure et al. | |
| 6,018,458 A * | 1/2000 | Delia et al. .................... | 361/690 |
| 6,154,368 A | 11/2000 | Scofield | |
| 6,364,009 B1 | 4/2002 | MacManus et al. | |
| 6,407,917 B1 | 6/2002 | Craft, Jr. et al. | |
| 6,856,769 B1 | 2/2005 | Steffensen et al. | |
| 7,015,570 B2 | 3/2006 | Emma et al. | |
| 7,180,740 B2 | 2/2007 | Li et al. | |
| 7,283,365 B2 | 10/2007 | Craft, Jr. | |
| 7,317,617 B2 * | 1/2008 | Meadowcroft et al. ........ | 361/715 |
| 7,345,873 B2 * | 3/2008 | Dey et al. ....................... | 361/695 |
| 7,355,857 B2 * | 4/2008 | Pirillis et al. ................... | 361/715 |
| 7,492,597 B2 * | 2/2009 | Huang ............................ | 361/719 |
| 2003/0169983 A1 * | 9/2003 | Branch et al. .................. | 385/92 |
| 2006/0118532 A1 | 6/2006 | Chung et al. | |
| 2007/0278060 A1 | 12/2007 | Kennedy et al. | |
| 2008/0130215 A1 * | 6/2008 | Mortensen et al. ............. | 361/684 |
| 2008/0278912 A1 * | 11/2008 | Zavadsky et al. .............. | 361/697 |
| 2010/0157531 A1 * | 6/2010 | Mason et al. ................... | 361/697 |

FOREIGN PATENT DOCUMENTS

| | | |
|---|---|---|
| GB | 2256337 | 2/1992 |
| JP | 6321636 | 11/1994 |
| WO | WO-2006/069571 | 7/2006 |

* cited by examiner

*Primary Examiner* — Courtney Smith  
(74) *Attorney, Agent, or Firm* — Klein, O'Neill & Singh, LLP

(57) ABSTRACT

A network device includes an airflow baffle. The baffle redirects cooling air toward a transceiver cage to increase a rate of heat transfer from electronic devices on the transceiver. The baffle is bi-directional, so that cooling air is redirected regardless of whether it flows in a front-to-back or back-to-front direction.

5 Claims, 2 Drawing Sheets

NETWORK DEVICE WITH BAFFLE FOR REDIRECTING COOLING AIR AND ASSOCIATED METHODS

BACKGROUND

1. Technical Field

The present invention relates to cooling network devices.

2. Related Art

A typical network device includes at least one printed circuit board (PCB) having at least one integrated circuit (IC) device. IC devices generate heat during operation. Excess heat can degrade the performance of the IC device. Therefore, it is important to provide cooling to IC devices. A typical cooling configuration for an IC device includes a heat sink secured to the IC device and cooling air circulated across the heat sink to carry heat away.

SUMMARY

The preferred embodiments of the present network device and associated methods have several features, no single one of which is solely responsible for their desirable attributes. Without limiting, the scope of the present embodiments as expressed by the claims that follow, their more prominent features now will be discussed briefly. After considering this discussion, and particularly after reading the section entitled "Detailed Description of the Preferred Embodiments," one will understand how the features of the present embodiments provide advantages, which include increased rate of heat transfer from heat-producing devices.

One embodiment of the present network device comprises a pluggable input/output (I/O) connector. The device further comprises an enclosure including a bezel forming a front or back wall of the enclosure. The bezel includes a first plurality of ventilation openings. An electromagnetic interference (EMI) cage engages the bezel. The cage encloses the connector. A first wall of the cage includes a second plurality of ventilation openings. A bi-directional airflow baffle is positioned in close proximity to the cage first wall. The baffle is configured to redirect cooling air flowing in a front-to-back or back-to-front direction through the enclosure toward the cage and through the second plurality of ventilation openings.

Another embodiment of the present network device comprises a pluggable input/output (I/O) connector. The device further comprises an enclosure including a bezel forming a front or back wall of the enclosure. The bezel includes a first plurality of ventilation openings. An electromagnetic interference (EMI) cage engages the bezel. The cage encloses the connector, and a first wall of the cage includes a second plurality of ventilation openings. A bi-directional airflow baffle is positioned in close proximity to the cage first wall. The baffle includes a first end portion that extends substantially parallel to the cage first wall at a first distance from the cage first wall, a second end portion that extends substantially parallel to the cage first wall at the first distance from the cage first wall, and an intermediate portion that is substantially U-shaped in profile and includes a convex surface facing the cage first wall.

One embodiment of the present methods of cooling a pluggable transceiver in a network device comprises drawing cooling air into an enclosure of the network device through a first plurality of ventilation openings in a bezel of the enclosure. The method further comprises passing, the cooling air through the enclosure and over an electromagnetic interference (EMI) cage within the enclosure in a front-to-back or back-to-front direction. The method further comprises directing the cooling air, using a bi-directional airflow baffle positioned in close proximity to a first wall of the cage, toward the cage first wall and through a second plurality of ventilation openings in the cage first wall.

BRIEF DESCRIPTION OF THE DRAWINGS

The preferred embodiments of the present network device and associated methods now will be discussed in detail with an emphasis on highlighting the advantageous features. These embodiments depict the novel and non-obvious network device and associated methods shown in the accompanying drawings, which are for illustrative purposes only. These drawings include the following figures, in which like numerals indicate like parts.

DETAILED DESCRIPTION

Figure 1:
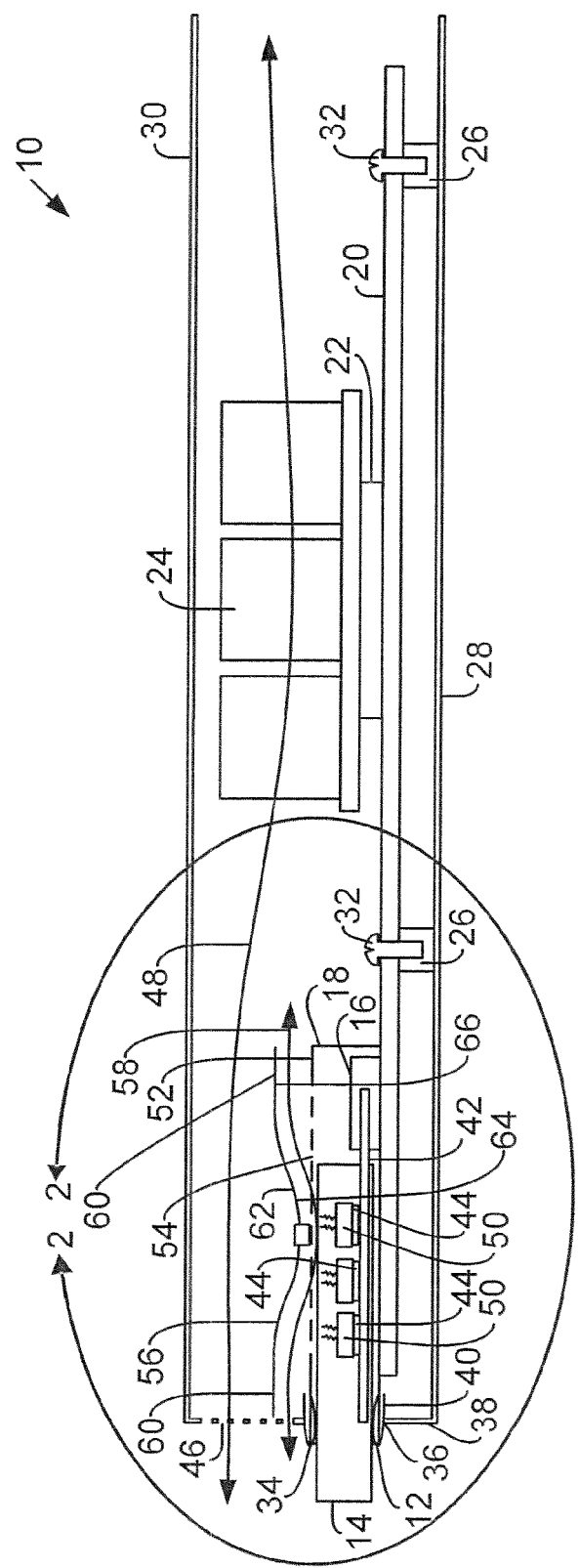
FIG. 1 is a schematic, cross-sectional, side elevation view of one embodiment of the present network device and method of cooling a network device.

The following detailed description describes the present embodiments with reference to the drawings. In the drawings, reference numbers label elements of the present embodiments. These reference numbers are reproduced below in connection with the discussion of the corresponding drawing features.

Figure 2:
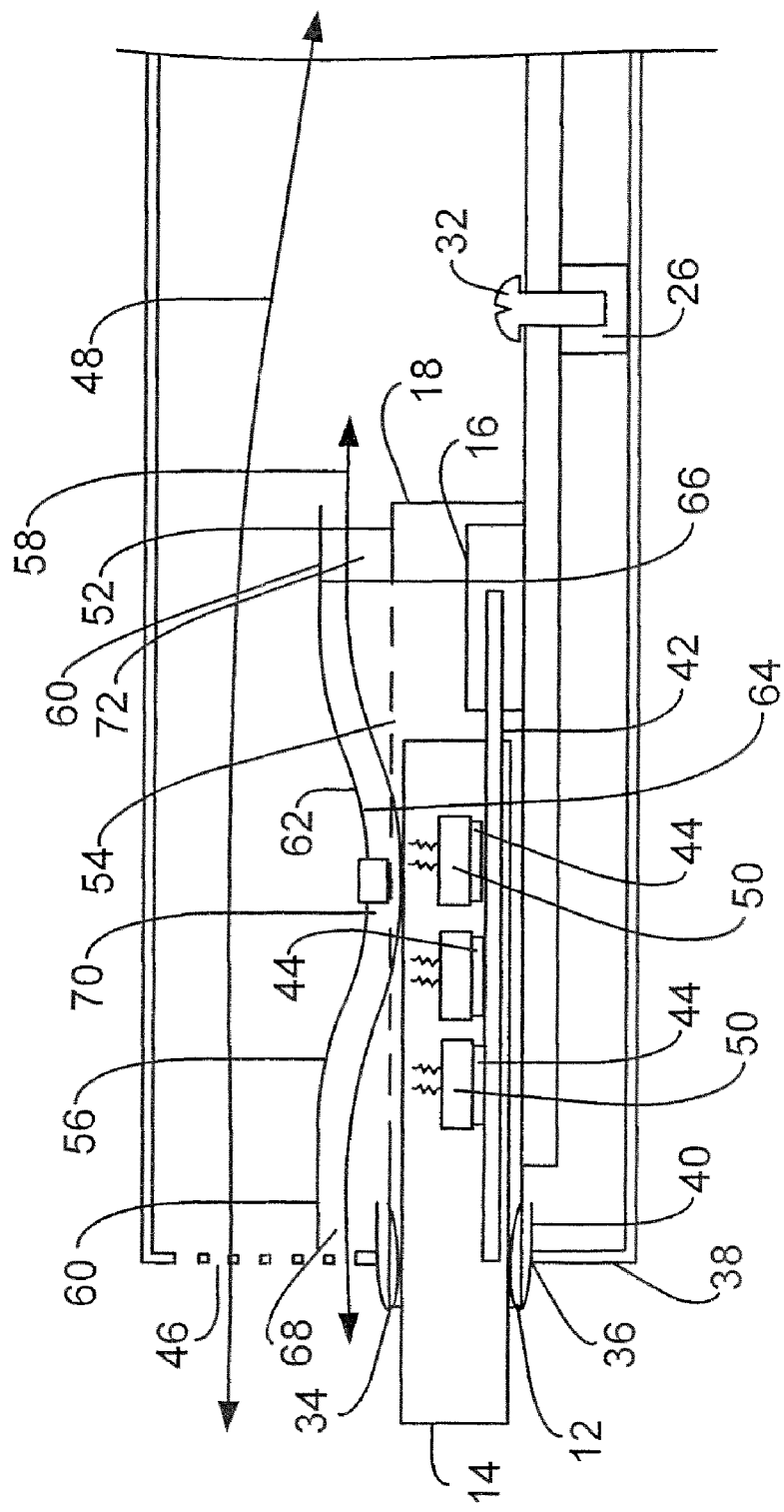
FIG. 2 is an enlarged detail view of the portion of FIG. 1 indicated by the circle 2-2.

FIG. 1 illustrates one embodiment of the present network device 10 and method of cooling a network device 10. FIG. 2 provides an enlarged detail view of the portion of FIG. 1 indicated by the circle 2-2. The device 10 may be, for example, a switch, a host system, a server, a peripheral, an input/output subsystem, a bridge, a hub or a router. The device 10 includes at least one external port 12, although in certain alternative embodiments the device may not include any external ports. The port 12 is configured to receive a transceiver 14 for enabling the device 10 to communicate with other network devices.

The port 12 comprises a pluggable input/output (I/O) connector 16 and an electromagnetic interference (EMI) cage 18. The connector 16 is secured to a printed circuit board (PCB) 20, which itself includes at least one electronic device 22, such as a processor or application-specific integrated circuit (ASIC). A heat sink 24 dissipates heat generated by the electronic device 22. Standoffs 26 extend upward from a floor 28 of an enclosure 30, which surrounds and protects the components of the network device 10. Fastening members, such as screws 32, secure the PCB 20 to the standoffs 26. A first end 34 of the EMI cage 18 extends through an opening 36 in a bezel 38 of the enclosure 30. The bezel 38 forms a front or back wall of the enclosure 30. Grounding fingers 40 adjacent the first end 34 of the EMI cage 18 engage the opening 36 and provide electrical grounding for the PCB 20 and related electronic components.

The EMI cage 18 receives the transceiver 14, such that a connector 42 on the transceiver 14 engages the connector 16 of the PCB 20. The transceiver connector 42 includes at least one electronic device 44, such as a processor or an ASIC. The electronic device 44 generates heat, which must be dissipated to prevent a decline in the transceiver's 14 performance. The present embodiments provide enhanced heat dissipation for the electronic device(s) 44, as described in detail below.

The bezel 38 includes a plurality of ventilation openings 46 that facilitate the circulation of cooling air through the device 10. As shown by the double-headed arrow 48 in FIGS. 1 and 2, cooling air may circulate through the device 10 in either the front-to-back or the back-to-front direction. The cooling air assists in transferring heat away from the heat sink(s) 24 attached to the electronic device 22 on the PCB 20, and away from the heat sink(s) 50 attached to the electronic device(s) 44 on the transceiver 14.

A first wall 52 of the cage 18 also includes a plurality of ventilation openings 54. The cage ventilation openings 54 allow the circulating cooling air to directly access the transceiver 14, thus enhancing the ability of the cooling air to transfer heat away from the transceiver 14. A bi-directional airflow baffle 56 is secured to the cage first wall 52, although in alternative embodiments the baffle 56 may be secured to something else, such as the bezel 38. As indicated by the arrow 58 in FIGS. 1 and 2, the baffle 56 directs cooling air downward toward the openings 54 in the cage 18. The baffle 56 thus redirects the cooling air so that a greater quantity of cooling air enters the cage 18. In the absence of the baffle 56, the cooling air would be travelling substantially parallel to the cage first wall 52. Thus, most of the cooling air would flow over the cage 18 and past the openings 54, rather than through the openings 54. The baffle 56 redirects the air so that it travels downward and through the openings 54 in the cage first wall 52. The baffle 56 thus increases the rate of heat transfer from the electronic device(s) 44 on the transceiver 14, since more of the cooling air travels into the cage 18 as a result of being redirected.

As shown in FIGS. 1 and 2, the airflow baffle 56 is bi-directional, meaning that it directs the cooling air downward regardless of whether the cooling air is moving through the network device 10 in the front-to-back or the back-to-front direction. In the illustrated embodiment, the baffle 56 includes first and second end portions 60 that extend substantially parallel to the cage first wall 52 at a first distance from the cage first wall 52. The baffle 56 further includes an intermediate portion 62 that is substantially U-shaped in profile and includes a convex surface 64 facing the cage first wall 52.

Advantageously, the baffle 56 is shaped to have a relatively large intake opening 68 adjacent the bezel 38 to allow more air to enter between the baffle 56 and the cage first wall 52. Then, the baffle 56 directs the air toward the cage 18 and through a narrow passage 70 between a center portion of the baffle 56 and the cage 18. The narrow passage 70 increases the air's velocity and, therefore, also increases cooling efficiency. The air exits the baffle 56 through a relatively large opening 72 on the other side. The relatively large opening 72 reduces pressure needed to move the air from one side of the baffle 56 to the other. It also makes the baffle 56 symmetrical front to back, which makes it bi-directional.

The baffle 56 can be made from variety of materials including metals such as steel, a typical material used for electronic enclosures, or plastics rated for use in electronic equipment. In any case, sheet material can be formed by various methods into a desired shape. The baffle 56 can be fastened to the cage 18 itself, to the bezel 56, to a printed circuit board or to features in the enclosure. It can be fabricated as a small individual baffle used with one cage, or as a continuous baffle used with many cages arranged in a row on a printed circuit board.

In one embodiment, a surface 66 of the baffle 56 that faces the cage 18 has a rough texture. The rough texture breaks up what might otherwise be laminar flow in the area of the cage 18 and creates turbulent flow. Fluid flowing in a turbulent fashion has a higher heat transfer coefficient than fluid flowing in a laminar fashion. Accordingly, the rough texture of the baffle 56 increases the rate of heat transfer from the electronic device(s) 44 on the transceiver 14 by creating turbulent flow.

SCOPE OF THE DISCLOSURE

The above description presents the best mode contemplated for carrying out the present network device and associated methods, and of the manner and process of making and using it, in such full, clear, concise, and exact terms as to enable any person skilled in the art to which it pertains to make and use this network device. This network device is, however, susceptible to modifications and alternate constructions from that discussed above that are fully equivalent. Consequently, this network device is not limited to the particular embodiments disclosed. On the contrary, this network device covers all modifications and alternate constructions coming within the spirit and scope of the network device as generally expressed by the following claims, which particularly point out and distinctly claim the subject matter of the network device.

What is claimed is:

1. A method of cooling a pluggable transceiver in a network device, the method comprising:
    drawing cooling air into an enclosure of the network device through a first plurality of ventilation openings in a bezel of the enclosure;
    passing the cooling air through the enclosure and over an electromagnetic interference (EMI) cage within the enclosure in a front-to-back or back-to-front direction; and
    directing the cooling air, using a bi-directional airflow baffle positioned in close proximity to a first wall of the cage, toward the cage first wall and through a second plurality of ventilation openings in the cage first wall by passing the air through a passage between the cage and a baffle plate, a height of the passage smoothly varying from a relatively tall air intake opening down to a relatively short central portion and back up to a relatively tall air outlet opening.

2. The method of claim 1, wherein the EMI cage is configured to receive a pluggable transceiver.

3. The method of claim 1, wherein the network device is a switch, a host system, a server, a peripheral, an input/output subsystem, a bridge, a hub or a router.

4. The method of claim 1, wherein the baffle includes a first end portion that extends substantially parallel to the cage first wall at a first distance from the cage first wall, a second end portion that extends substantially parallel to the cage first wall at the first distance from the cage first wall, and an intermediate portion that is substantially U-shaped in profile and includes a convex surface facing the cage first wall.

5. The method of claim 1, wherein the baffle is symmetrical in profile.

* * * * *

UNITED STATES PATENT AND TRADEMARK OFFICE
CERTIFICATE OF CORRECTION

PATENT NO. : 8,068,338 B1  
APPLICATION NO. : 12/410277  
DATED : November 29, 2011  
INVENTOR(S) : Tamarkin Page 1 of 1

It is certified that error appears in the above-identified patent and that said Letters Patent is hereby corrected as shown below:

In column 1, line 24, delete "limiting," and insert -- limiting --, therefor.

In column 1, line 64, delete "passing," and insert -- passing --, therefor.

Signed and Sealed this  
Twenty-eighth Day of February, 2012

David J. Kappos  
*Director of the United States Patent and Trademark Office*